United States Patent [19]
Kan et al.

[11] Patent Number: 5,106,451
[45] Date of Patent: Apr. 21, 1992

[54] HEAT SINK AND METHOD OF ATTACHMENT

[75] Inventors: John C. Kan, Poughkeepsie; Carl Yakubowski, Hyde Park, both of N.Y.

[73] Assignee: International Business Machines Corporation, Armonk, N.Y.

[21] Appl. No.: 614,795

[22] Filed: Nov. 15, 1990

[51] Int. Cl.$^5$ ............................................... B30B 5/02
[52] U.S. Cl. ..................... 156/583.3; 156/298; 156/541; 156/580; 156/581
[58] Field of Search ............... 156/298, 311, 541, 580, 156/581, 583.3; 100/211

[56] References Cited

U.S. PATENT DOCUMENTS

| | | | |
|---|---|---|---|
| 1,806,861 | 5/1931 | Owen | 156/311 |
| 3,533,352 | 10/1970 | Miller | 156/583.3 |
| 3,964,958 | 6/1976 | Johnston | 156/448 |
| 3,971,435 | 7/1976 | Peck | 165/78 |
| 4,092,697 | 5/1978 | Spaight | 361/386 |
| 4,203,129 | 5/1980 | Oktay et al. | 357/82 |
| 4,619,316 | 4/1985 | Nakayama et al. | 165/104.33 |
| 4,620,216 | 6/1986 | Horvath | 357/81 |
| 4,653,163 | 3/1987 | Kuwahara et al. | 29/157.3 |
| 4,686,606 | 8/1987 | Yamada et al. | 361/385 |
| 4,694,323 | 9/1987 | Itahana et al. | 357/82 |
| 4,737,228 | 4/1988 | Bridgland | 156/382 |
| 4,826,593 | 5/1984 | Nev | 100/211 |

OTHER PUBLICATIONS

IBM Technical Disclosure Bulletin, vol. 31, No. 3, Aug. 1988, "Testable High Performance Module", by Katyl et al., pp. 158–160, Letter to Yakubowski dated Jun. 13, 1988, re: Pyralux.

Research Disclosure #28852, Apr. 1988, "Heat Sink Having High Ratio Fluid Channels . . . Manufacture", p. 224.

IBM Technical Disclosure Bulletin, vol. 23, No. 8, pp. 3623–3624, Jan. 1981, "Fixture for . . . Module" by E. Kunkler et al.

IBM Technical Disclosure Bulletin, vol. 22, No. 6, pp. 2297–2298, Nov. 1979, "Heat Sink Design . . . Environment" by Arnold et al.

IBM Technical Disclosure Bulletin, vol. 19, No. 5, p. 1640, Oct. 1976, "Pressure-Sensitive Tape . . . Application" by Christie et al.

Primary Examiner—W. Gary Jones
Assistant Examiner—David Reifsnyder
Attorney, Agent, or Firm—Richard M. Ludwin

[57] ABSTRACT

An apparatus and method for removably mounting heat sinks on a chip carrying substrate by simultaneously applying pressure to both the heat sinks and the substrate. Also disclosed is a three dimensional heat sink having a plurality of spatially interconnected holes formed therein. The holes act as extended boiling surfaces which also promote agitation induced by bubble motion.

5 Claims, 12 Drawing Sheets

HEAT SINK AND METHOD OF ATTACHMENT

BACKGROUND OF THE INVENTION

1. Field of the Invention

The present invention relates to heat removal devices and the attachment of heat removal devices to integrated circuit chips.

2. Related Art

Recent trends in chip design, toward highly integrated circuits, have necessitated special cooling techniques to accommodate high heat fluxes from integrated circuit chips. One conventional method of removing heat from the integrated circuits is to place to integrated circuits within a cooling module which either acts as a heat sink itself, or has a heat sink attached. Another conventional method of removing heat is to attach individual heat sinks to the back of the integrated circuit chips.

One method of mounting heats sinks to the backside of metalized ceramic modules is disclosed in an article entitled "FIXTURE FOR ASSEMBLING HEAT SINK TO MODULE" (IBM technical Disclosure Bulletin, Volume 23, No. 8, January 1981, Pages 3623-3624). The article describes an apparatus in which the heat sinks, modules and uncured adhesive epoxy preforms, are loaded into a fixture and held in place by guides and channels. After the heat sinks, modules and preforms have been properly placed into the fixture, a top cover is affixed thereto. By tightening studs on the top cover, springs are tightened. The springs, in turn, place a controlled force on a bar which is engaged to the bottom of the fixture. When the correct pressure has been applied between the heat sinks and the modules, the fixture is placed in a curing oven to effect the bond between the heat sink and the module with the epoxy preform.

While the above-described apparatus is suitable for attaching single heat sinks to each of a number of metalized ceramic modules, simultaneously attaching a plurality of heat sinks to the backs of integrated circuit chips mounted on a large substrate is problematic. Modern substrates are often made of glass ceramic rather than metalized ceramic (as is used in the module of the aforedescribed article). Because glass ceramic substrates are more brittle and in many instances larger than the metalized ceramic module of the aforementioned article, they are more prone to crack when pressure is applied. Further, fixtures such as the one described in the TDB article, which attempt to hold the substrate or module rigidly in place, only increase the likelihood of cracking.

Another problem, not addressed by the above described apparatus is that of removably mounting the heat sinks to the backs of the integrated circuit chips in a fast and efficient manner. Removably mounting the heat sinks is particularly important for burn in and manufacturing test operations, and presents several challenges. One such challenge, is removably mounting the heat sink in such a manner that the thermal interface between the heat sink and the chip is not degraded.

The burn in and test of apparatus using integrated circuit chips requiring high heat dissipations presents even more challenges. For example, since burn in temperatures will typically run hotter than standard operational temperatures, the margin between the functional temperature limit of the chip and the environment is greatly reduced. Thus, efficient heat extraction must be ensured. Further, since any failure in the heat sink/chip interface can cause costly chip damage, the attachment and thermal interface between the chips and the heat sinks must be secure, while at the same time be reversible so that the substrate and chips can be encapsulated into an electronic module after test.

SUMMARY OF THE INVENTION

In light of the foregoing concerns, it is a first object of the invention to provide an improved system and method for securely and efficiently mounting a plurality of heat sinks on a plurality of integrated circuit devices on a large substrate.

It is a second object of the invention to provide an improved heat sink which is easily mountable, easily removable and well suited for nucleate boiling cooling environments.

In accord with the first object there is disclosed a system and method for removably mounting heat sinks on a chip carrying substrate by simultaneously applying pressure to both the heat sinks and the substrate.

In accord with the second object, there is disclosed a three dimensional heat sink having a plurality of spatially interconnected holes formed therein. The holes act as extended boiling surfaces which also promote agitation induced by bubble motion.

BRIEF DESCRIPTION OF THE DRAWINGS

The present invention will be better understood by reference to the accompanying drawings, in which.

DETAILED DESCRIPTION OF THE PREFERRED EMBODIMENTS

Figure 1:
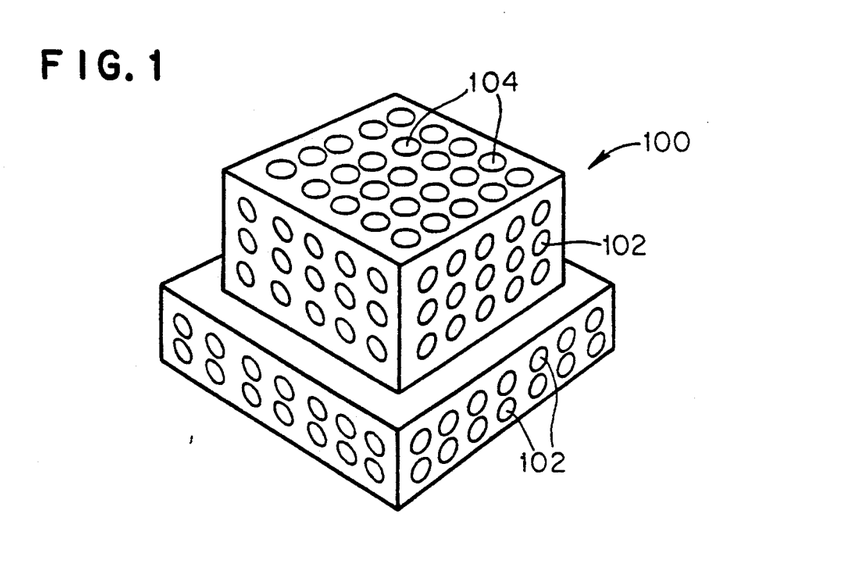
FIG. 1 is a side isometric view of three dimensional heat sink having a plurality of spatially interconnected holes formed therein.

The improved heat sink 100, depicted in FIG. 1, utilizes spatially interconnected cavities/holes as extended boiling surfaces which also promote agitations induced by bubble motion. Attached to the chip, the heat sink increases the effective heat transfer area of the chip by over ten times and the machined surface imperfections serve as bubble nucleation sites.

Two other design features contribute to maximizing the conductive heat flow through the body of the heat sink. First, the material is oxygen free copper, which has a very high thermal conductivity. Second, the bottom surface of the heat sink is scored to form galleys for the retention of the thermally conductive adhesive and the remainder of the heat sink's bottom surface has a mirror finish, insuring maximum contact (no trapped air) between the heat sink and the chip.

The heat sink 100 is fabricated in the following manner. A block of oxygen free copper is reduced by machining or by casting to the desired dimensions. The finish shape is a small block centered on a base of slightly larger perimeter. The block is perforated with a plurality of regularly spaced small holes.

Figure 2:
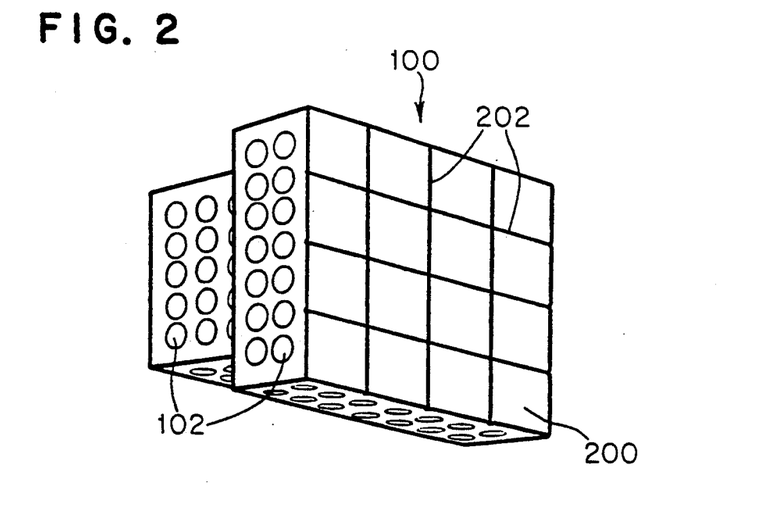
FIG. 2 is a bottom isometric view of the heat sink of FIG. 1.

On the four sides perpendicular to the base, a first plurality of holes 102 extend through the heat sink (i.e. from both front-to-back and side-to-side). Another plurality of holes 104 in the top surface penetrate deep into the heat sink, but not through it. As a result of this configuration, each hole intersects with two other sets of holes, (i.e. one set from each transverse direction. As is best illustrated in FIG. 2, the bottom (chip contacting) surface 200 of the heat sink is scored with a plurality of equally spaced, perpendicular scribe lines 202. Finally, the bottom surface is ground and lapped to a mirror finish.

An exemplary heat sink was fabricated in the following manner. A block of oxygen free copper was reduced by machining to block 3/16 inch square by 7/64 inch high, centered on a base ¼ inch square by 0.068 inch high. The block was perforated by drilling 29 holes (diameter 0.02 inches) completely through each opposing side of the heat sink except for the top. Thus a total 58 holes were drilled through the sides of the heat sink (2 rows of 7 through each side of the base and 3 rows of 5 through each side of the upper portion) so as to extend through the part. Another 25 holes (0.02 inch diameter) were then drilled into the top surface (i.e. the 3/16 inch square exposed surface) so as to penetrate 0.155 inches deep into the part. Thus each hole through the top intersected with 10 other holes, five from each transverse direction. The bottom surface of the heat sink was scored with six equally spaced, perpendicular scribe lines, 3 in each direction. Finally, the bottom surface was ground and lapped to a mirror finish.

A thin film (e.g. 0.0005 inches thick) of thermally conductive acrylic adhesive with paper carrier is tacked to the bottom of the heat sink. It is preferred that the acrylic be of a type that includes an alumina filler (e.g. Pyralux (TM), manufactured by E.I. Du Pont De Nemours Company of Wilmington Delaware). The carrier is then removed from the bottom of the thin film and the heat sink is located and held in place, and pressed against the chip under an elevated temperature for a preset cure time. After the application cycle, the chip/heat sink assembly is removed from the oven and allowed to cool under the same joining pressure.

It should be understood that the word "adhesive", as used in the present document, also encompasses thermally conductive thin films which will adhere to both the heat sinks and the integrated circuit chips under the application of the proper pressure and temperature. Examples of such films include: film of alumina filled acrylic, film of diamond filled epoxy, film of an elastomeric compound filled with heat conductive materials such as diamond platelets, aluminum or aluminum oxide powder.

An apparatus for tacking an adhesive backing to a plurality of heat sinks and for bonding the adhesive laden heat sinks to a substrate carrying an array of integrated circuit chips will now be described by reference to FIGS. 3 through 11.

Figure 3:
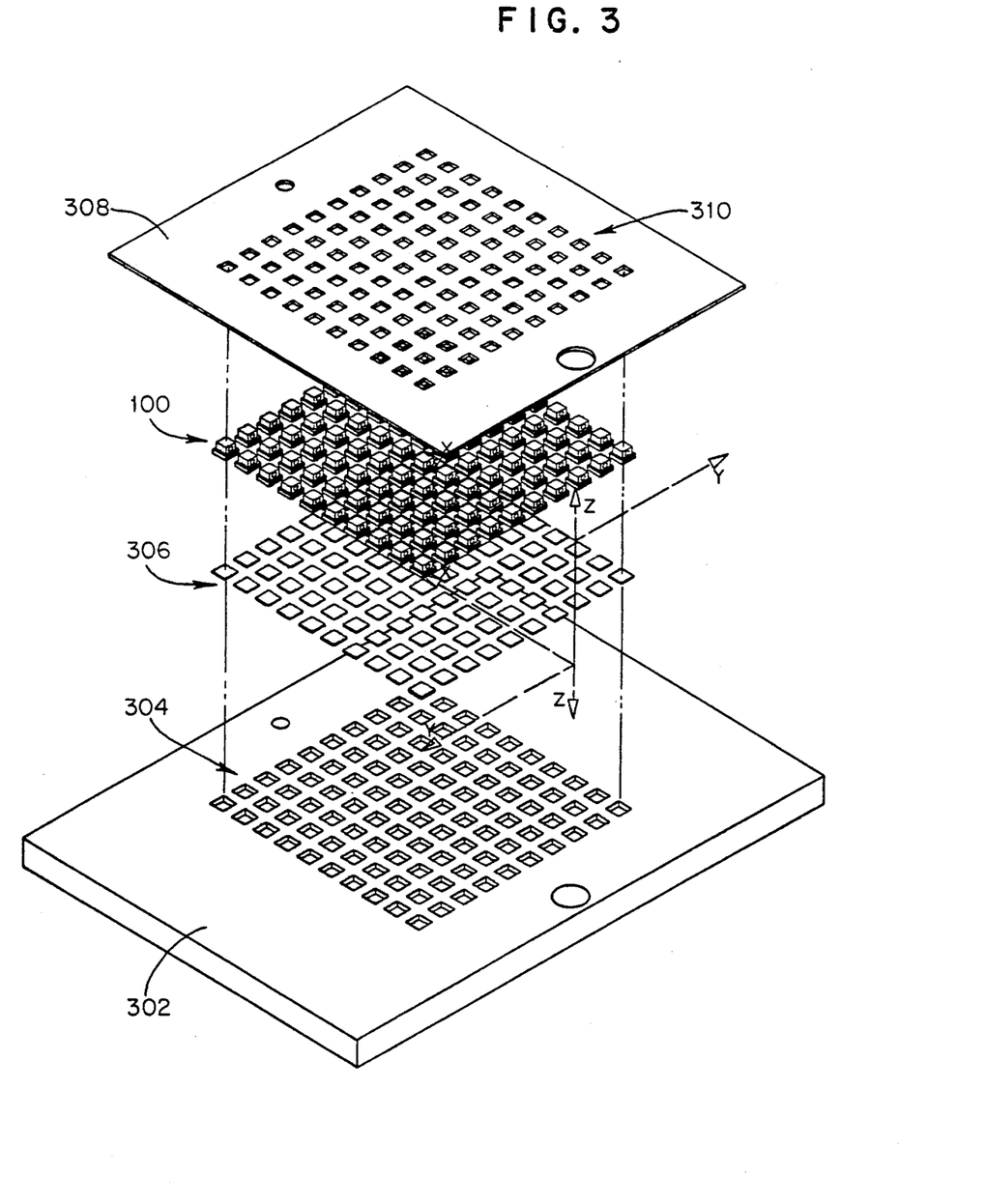
FIG. 3 is an exploded view showing components of an apparatus for mounting an adhesive backing on a plurality of heat sinks and for mounting the plurality of heat sinks on a substrate.

As best seen in FIG. 3, the apparatus includes a press plate 302 which has a matrix of cavities 304 formed therein for receiving adhesive blanks 306 of the type described above. The adhesive blanks 306 are of the same shape and size as the bottom surface 200 of the heat sink 100 of FIGS. 1 and 2. The cavities 304 are of just large enough dimensions to receive the larger perimeter portion of the heat sinks and the adhesive blanks. The depth of the cavities is preferably slightly greater than the depth of the wider perimeter portion of the heat sinks 100. In any event, the depth of the cavities must be such that the heat sinks and blanks will be pressed against the bottom of the press plate when the apparatus is assembled and the membrane (explained later) is inflated.

The apparatus also includes a carrier plate 308 which has a matrix of rectangular openings 310 formed therethrough which receive and the smaller perimeter portion of the heat sinks 100. The openings 310 in the carrier plate 308 are just large enough to allow the smaller perimeter portion of the heat sink of FIG. 1 to pass through and are disposed so that they will align and hold bottoms 200 of the larger perimeter portions of the heat sinks 100 snugly against the adhesive blanks 306 when the tack array plate 302 is secured to the carrier plate 308.

Figure 4:
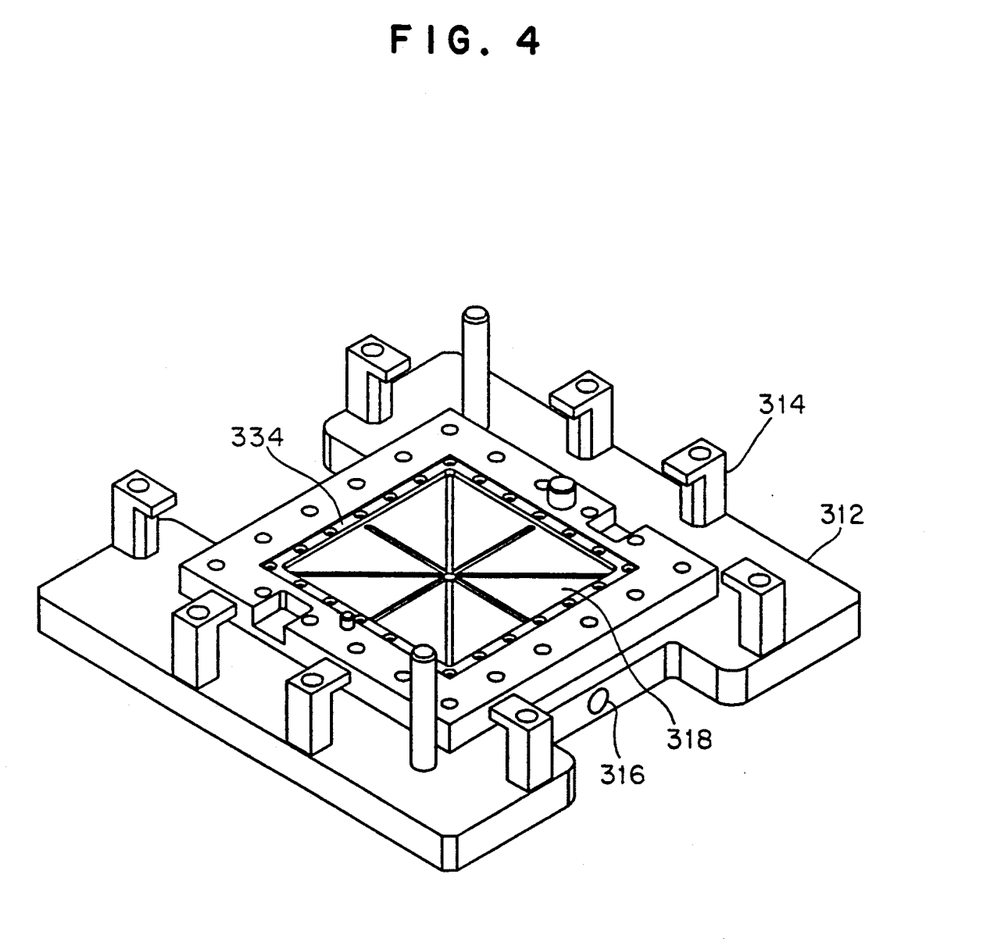
FIG. 4 shows a base fixture used in conjunction with the components of FIG. 3.

Turning now to FIG. 4, it will be observed that the apparatus also includes a base fixture 312. The base fixture 312 includes rotatable L brackets 314. The L brackets 314 are disposed hold the press plate 302 and the carrier plate 308 in close proximity to each other so that the bottoms 200 of the larger perimeter portions of the heat sinks are held snugly against the adhesive blanks 306. The base fixture also includes an air inlet valve 316 which is used to inflate and deflate a membrane 318 located within.

Figure 8:
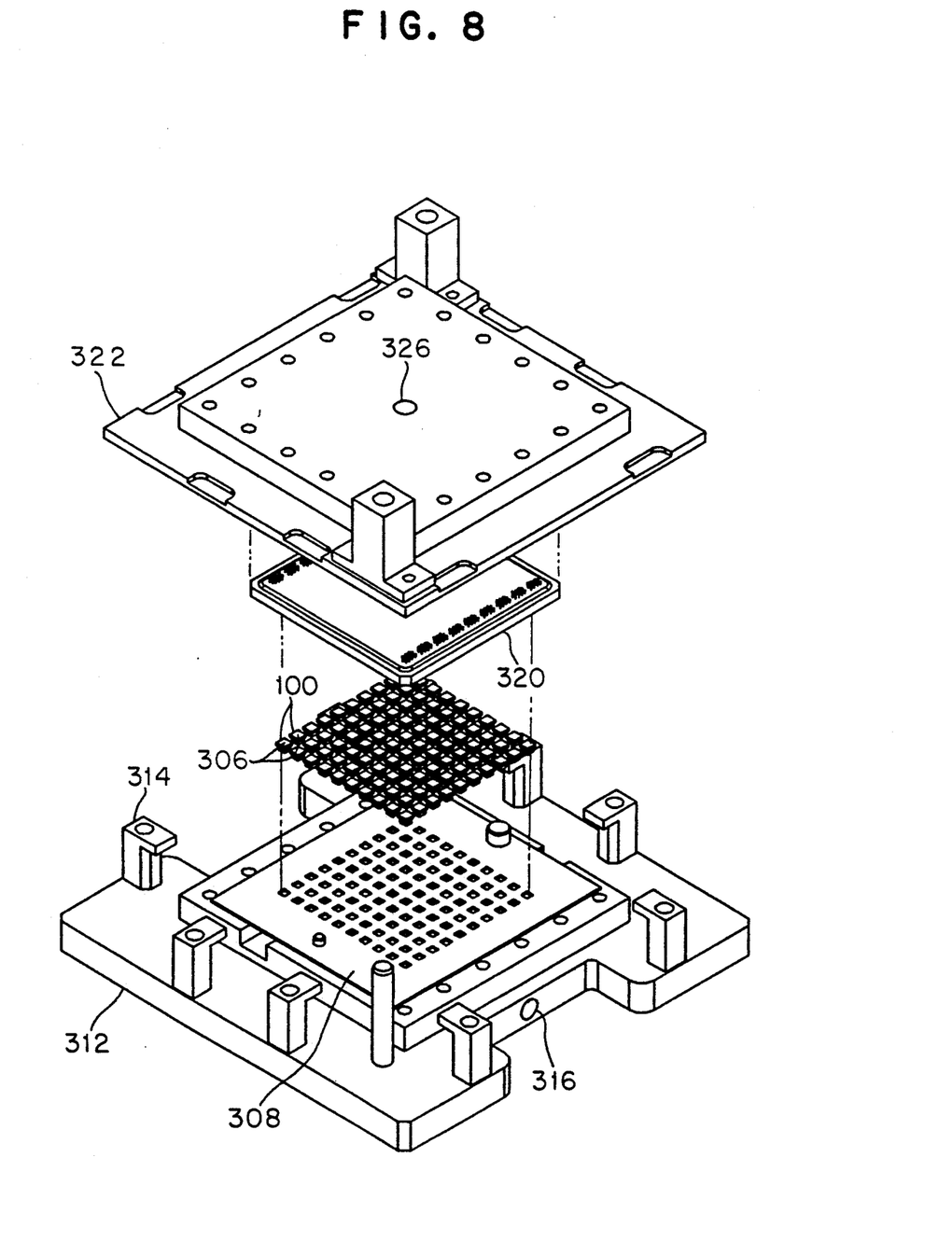
FIG. 8 shows an exploded view of the substrate holding fixture.
Figure 9:
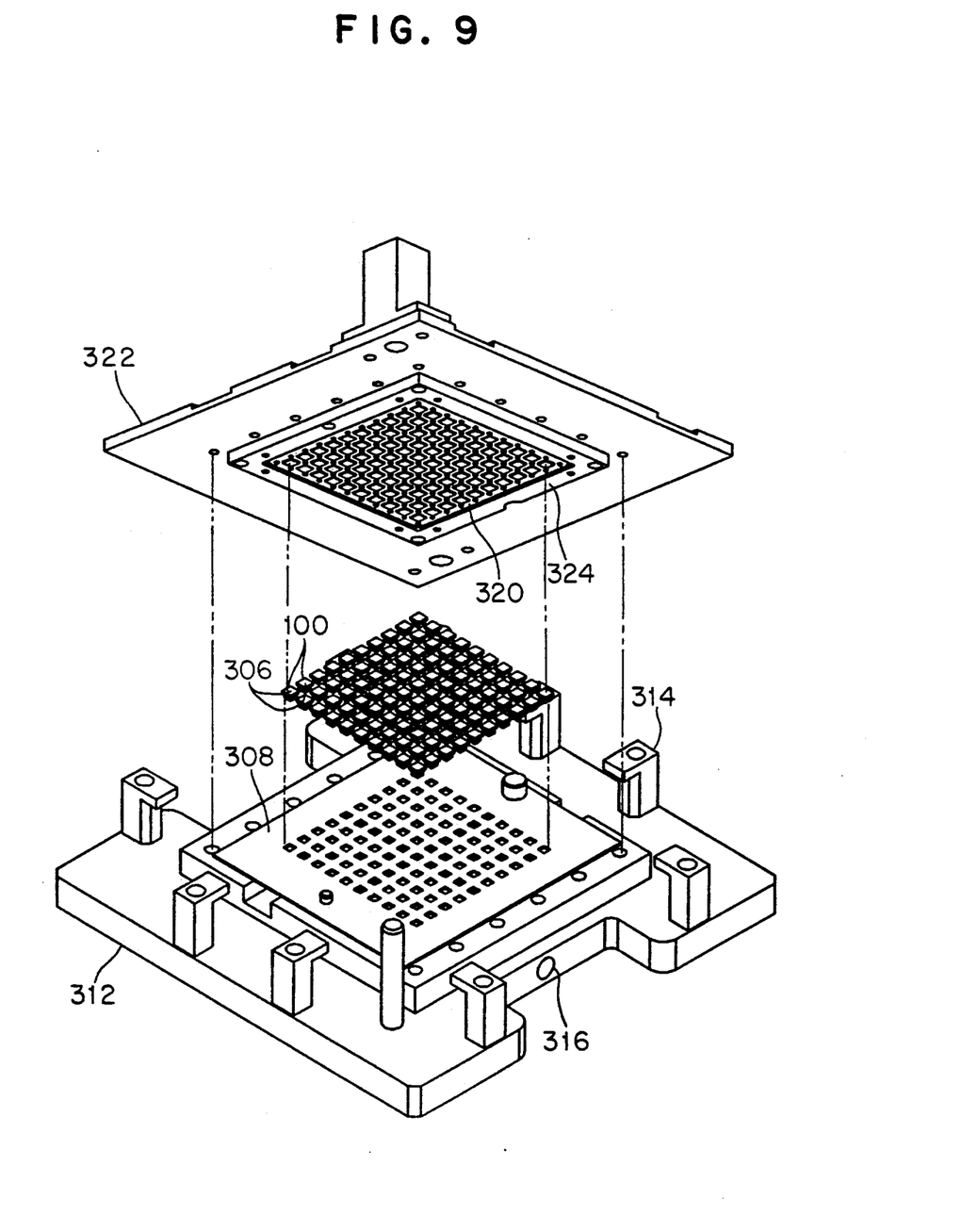
FIG. 9 shows the substrate secured to its holding fixture.
Figure 10:
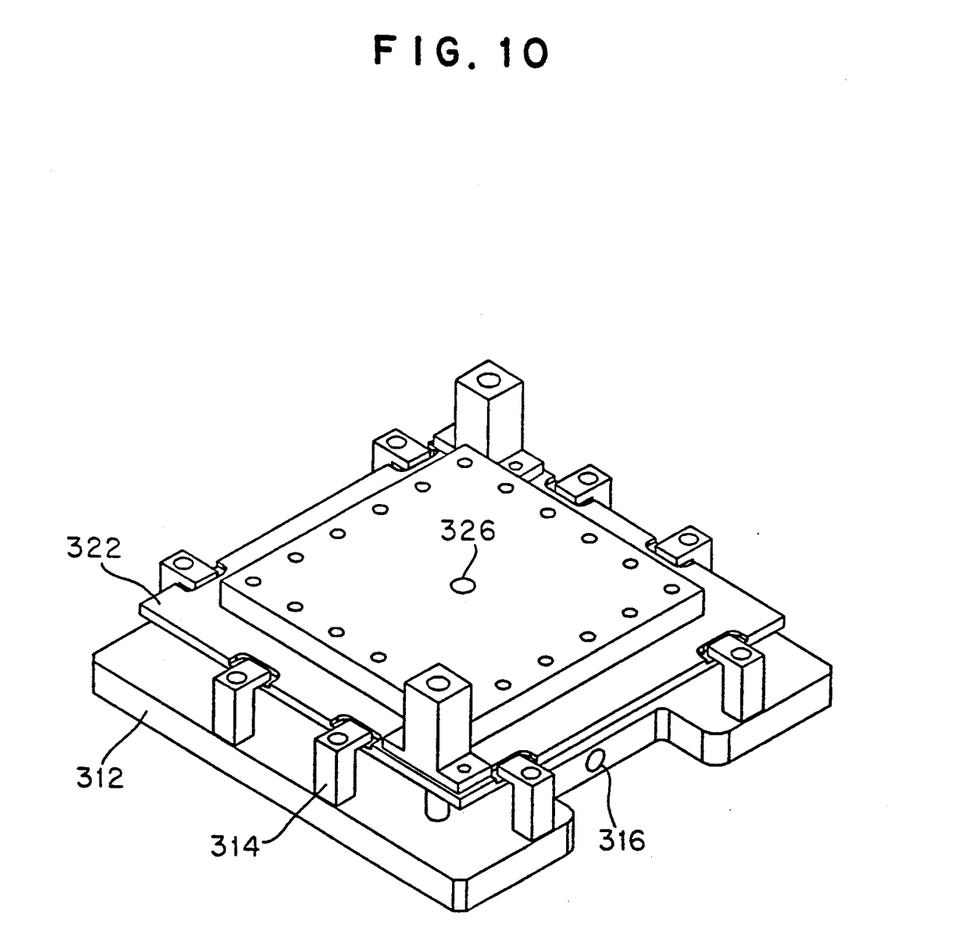
FIG. 10 illustrates the secured heat sink bonding assembly.

Turning now to FIGS. 8 and 9, it will be observed that the apparatus also includes a substrate holding fixture 322. A frame 324 is also provided for holding a substrate 320 securely to the substrate holding fixture by way of screws. Like the base fixture 312, the substrate holding fixture 322 also includes and air inlet valve 326 which is used to inflate a membrane 328 located within the fixture 322. The membrane 328 (not shown in FIGS. 8 and 9) is best seen in the cutaway view of FIG. 11.

Figure 11:
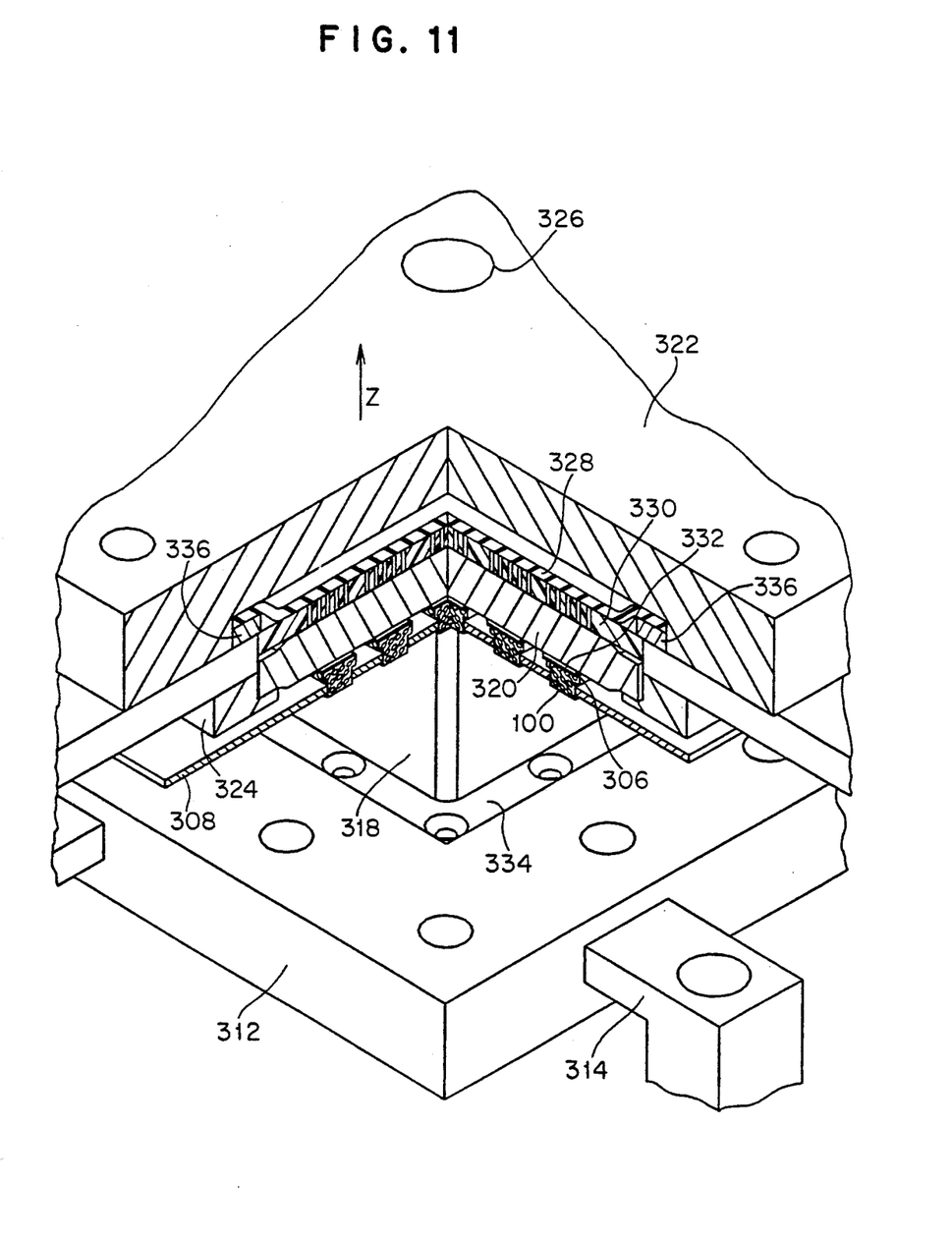
FIG. 11 illustrates a partial fragmented view of the bonding assembly.

As best seen in FIG. 11, the apparatus also includes is pin mask 330 which has holes formed therein which correspond in position, to the positions of pins (from integrated circuits and the like) as they appear on the back side the substrate 320. The pin mask 330 protects the substrate fixture membrane 328 from the pins and thus needs to be as least as thick as the longest pin which comes through the substrate.

In the apparatus of FIGS. 3 through 11, each the membranes 318, 328 is held in place by a frame 334, 336.

Exemplary materials for the apparatus are as follows: The frame 320 is made of Rulon (Trademark of E.I. Du Pont De Nemours Company of Wilmington, Del.). The membranes 318, 328 are made of silicon rubber. The tack array plate 302, and base 312 are made from aluminum. The pin mask 330 is made from phenolic. The reminder of the apparatus is made of stainless steel. The fittings, used to bring air to the apparatus are made of conventional materials, e.g. brass or stainless steel.

Figure 12:
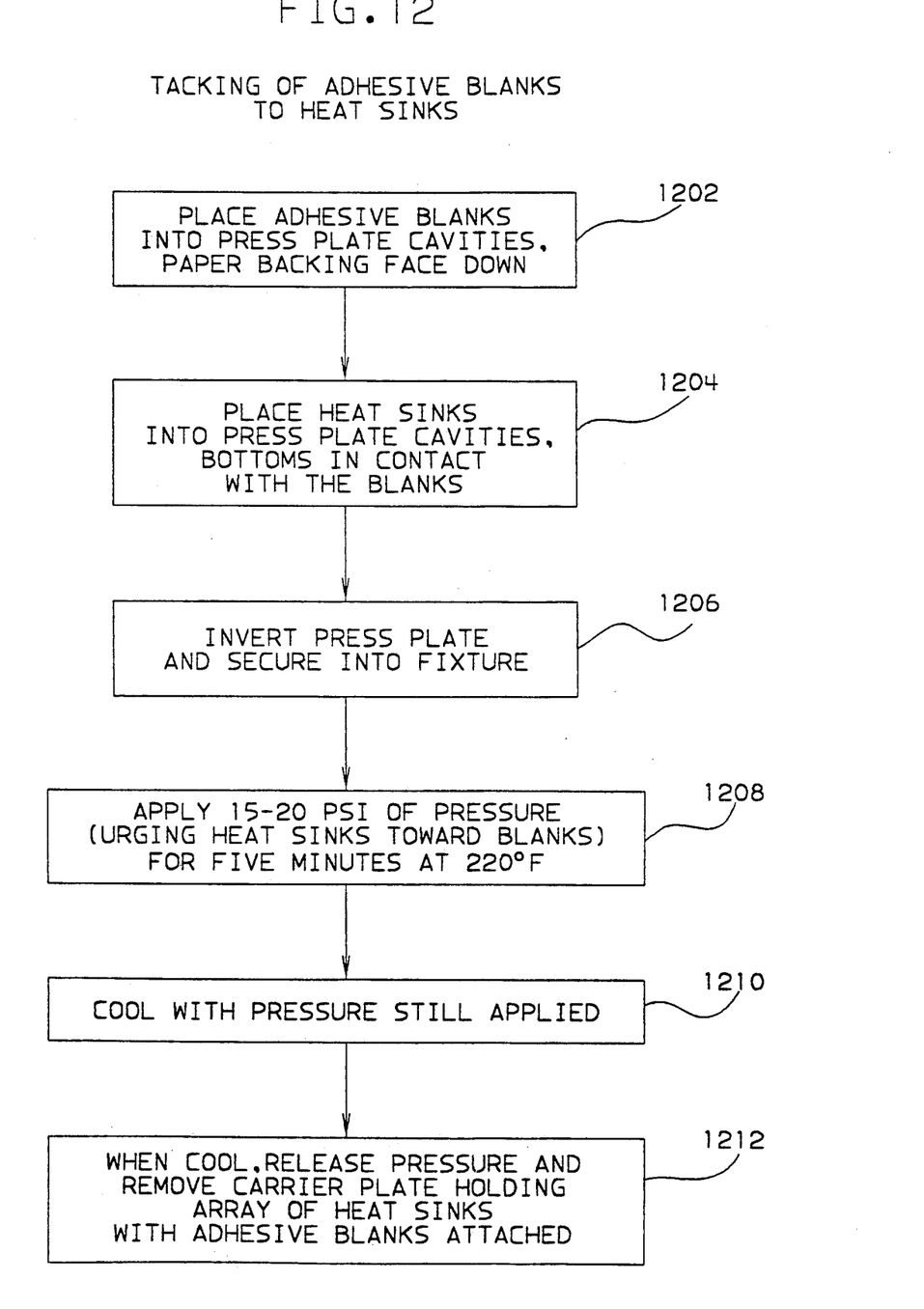
FIG. 12 is a flow chart showing the process of tacking the adhesive blanks or thermally conductive film thin film to the heat sinks.

The process of tacking the adhesive blanks 306 to the heat sinks 100 will be now be described by reference to FIGS. 3 through 6 and the flow chart of FIG. 12. As a first step (step 1202) in the attachment process, the adhesive blanks 306 are placed into the cavities 304 of the press plate 302, adhesive side up (paper carrier side down). The heat sinks 100 are then assembled into the press plate cavities 302 so that the bottom surfaces 200 of the heat sinks are in contact with the adhesive blanks 306 (step 1204).

Figure 5:
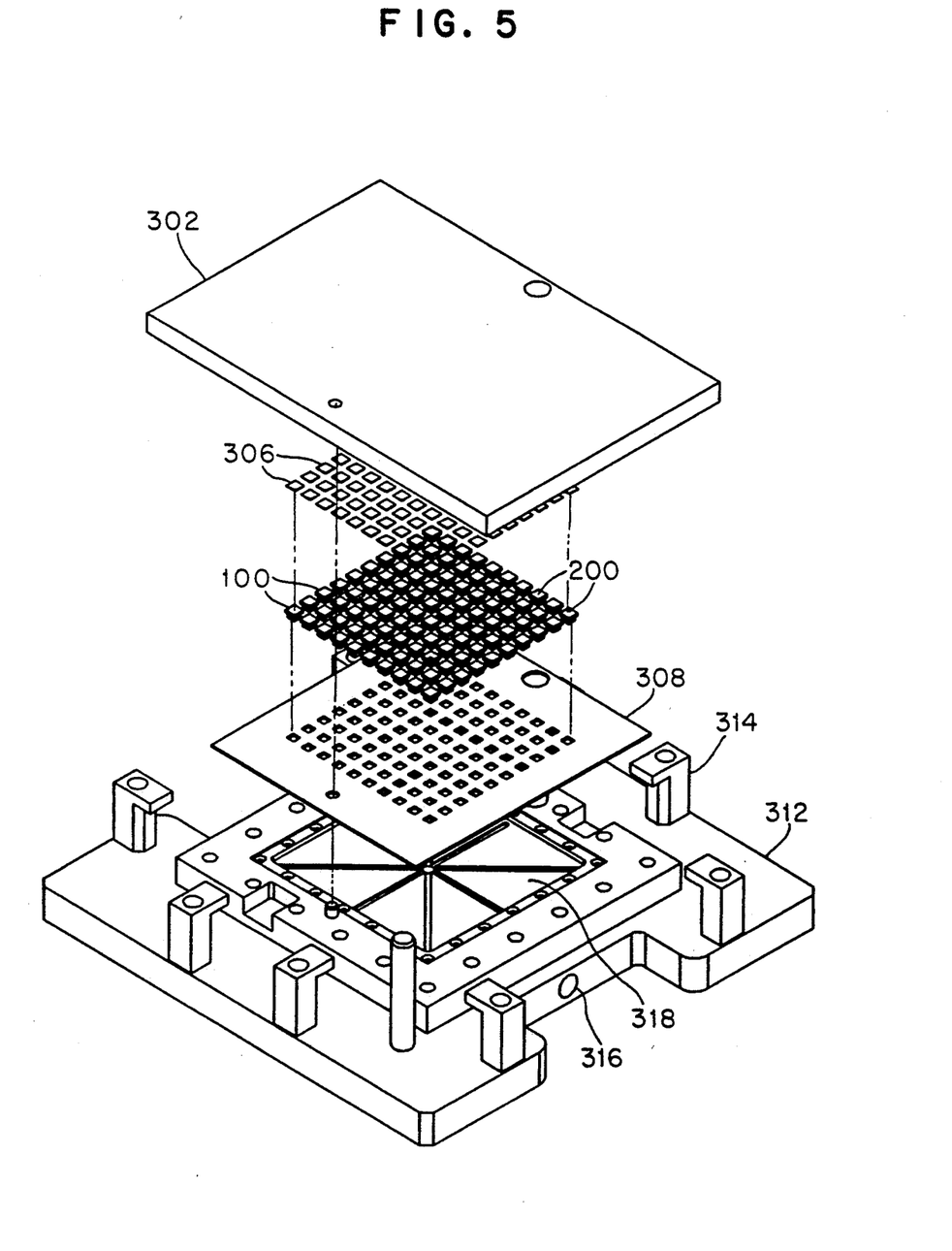
FIG. 5 is an exploded order of contents as they would appear when placing the carrier plate on the base fixture prior to securing.
Figure 6:
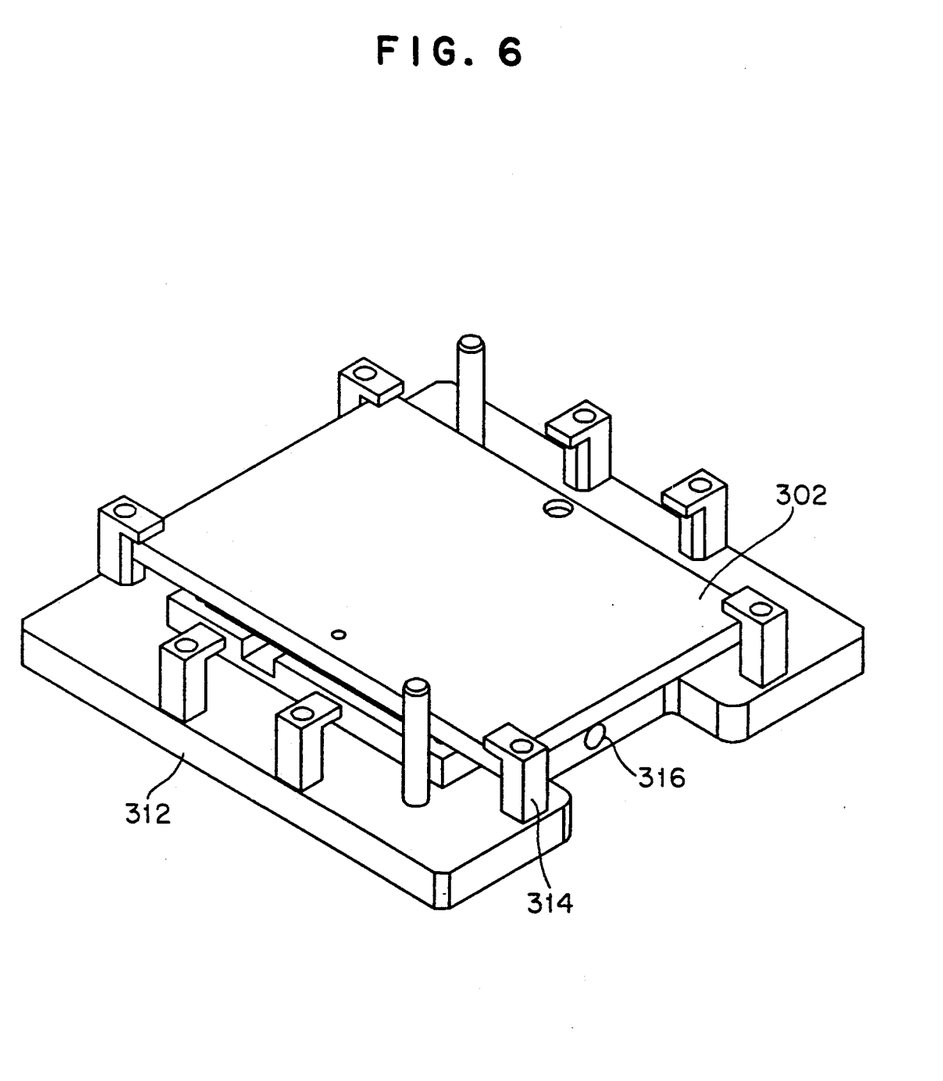
FIG. 6 shows the secured tacking assembly.

Next (step 1206), as best seen in FIG. 5, the carrier plate 308 is placed on top of the press plate 302 and the carrier/press plate assembly is inverted and placed on to the base fixture 312. The L brackets 314 are then rotated to keep the fixture together. The assembled fixture, as illustrated in FIG. 6, is then placed into a convection oven and an air pressure lines is attached to the air inlet 316.

Figure 7:
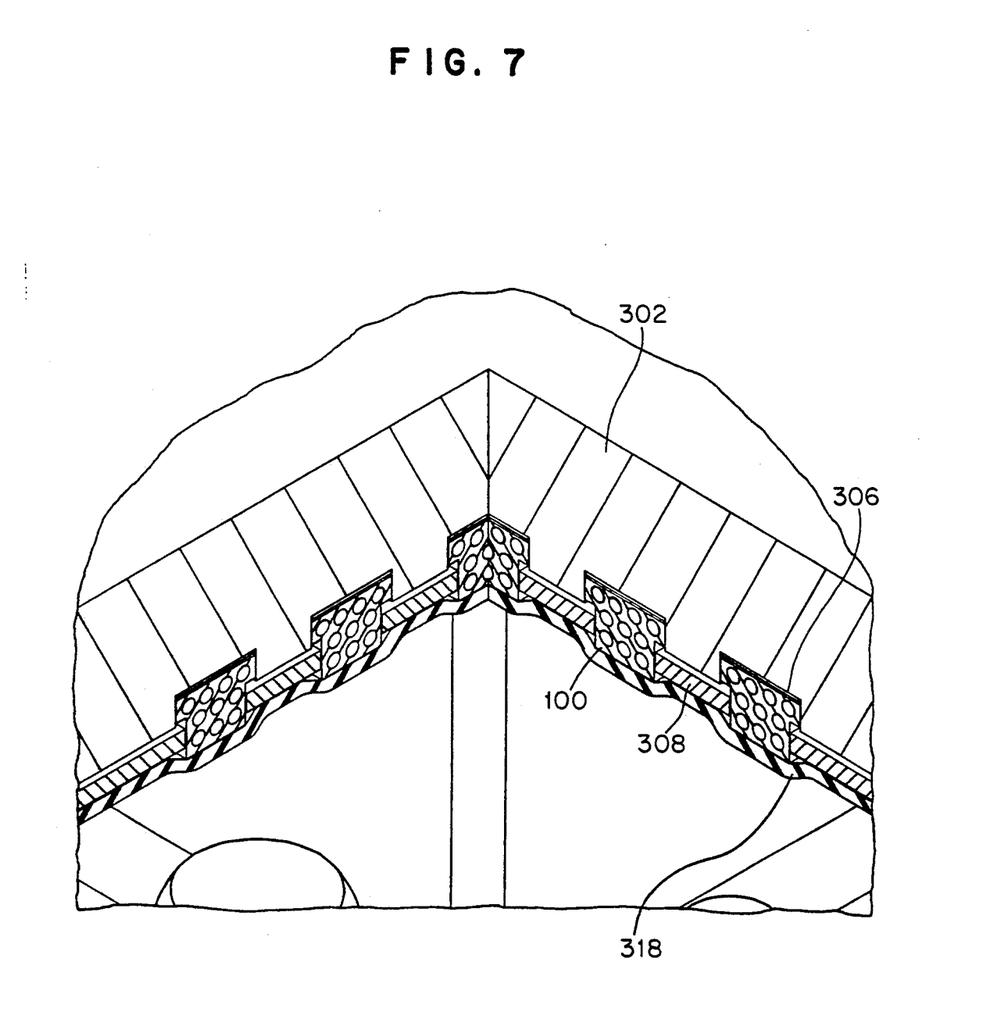
FIG. 7 illustrates a partial section and fragmented view of the tacking assembly.

Next (step 1208), the inflatable membrane 318 is inflated with air, pushing the heat sinks 100 against the adhesive blanks 306. Pressure, temperature and time are used to control the adhesive tacking. Preferably, the membrane is inflated to 15-20 PSI and the fixture is heated for 5 minutes at 220 degrees F. The apparatus with the membrane 318 inflated is best illustrated in FIG. 7. After the 5 minutes of heating, the entire fixture assembly is removed from the oven and allowed to cool with the pressure still applied (step 1210). After cooling (step 1212), the pressure is relieved, the L brackets 314 are rotated, the press plate is removed from the fixture 312, the assembly is inverted and the carrier plate 308 holding an array of prepared heat sinks is removed.

Figure 13:
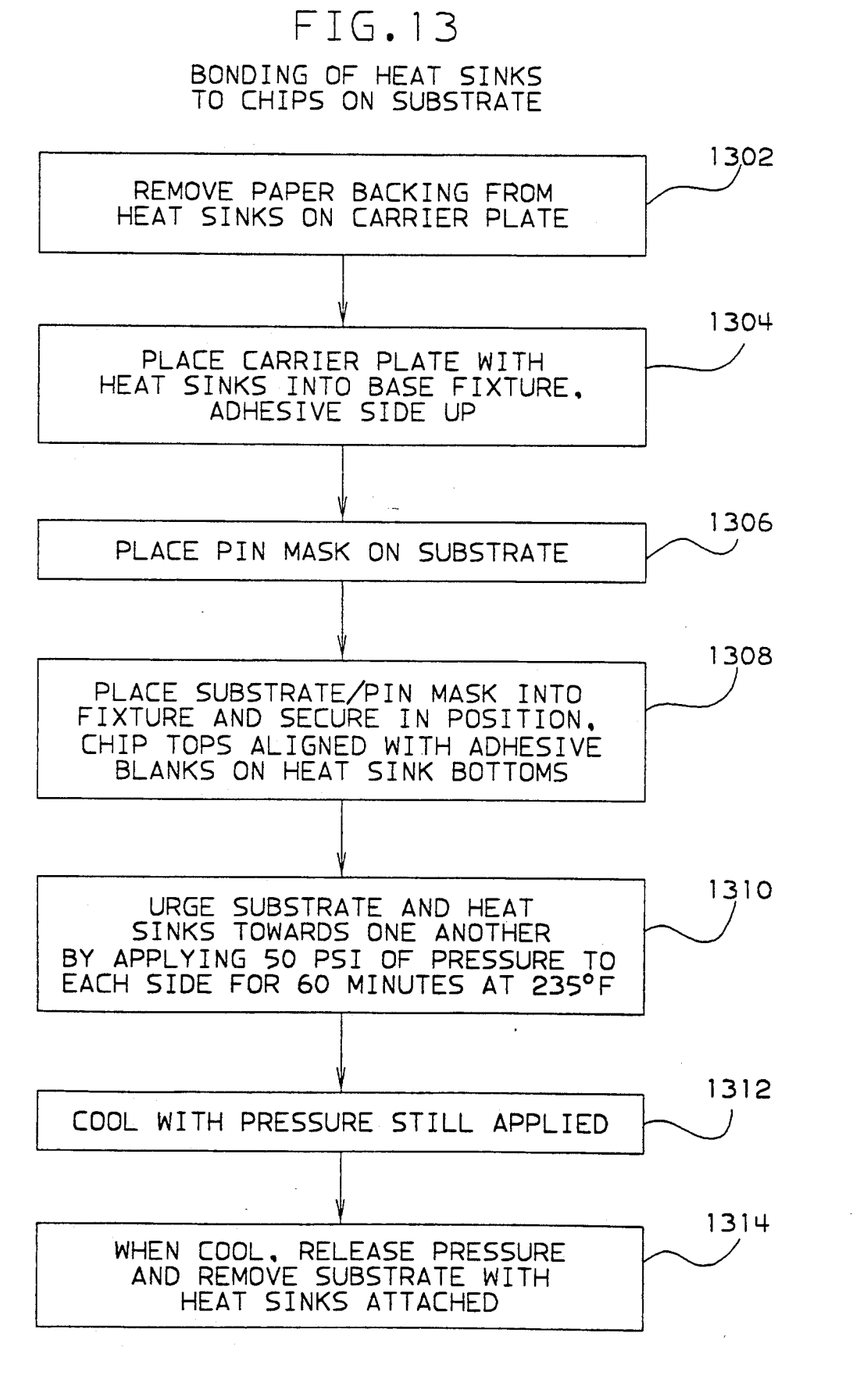
FIG. 13 is a flow chart showing the process of bonding the heat sinks to chips mounted on a substrate.

The process for attaching the heat sinks to the integrated circuit chips on the substrate will now be described by reference to FIGS. 8 through 11 and the flow chart of FIG. 13. First (step 1302), the adhesive paper backing is removed from the heat sinks 100 while they are still in place in the carrier plate 308. The carrier plate 308, with the heat sink array in place, is then placed into the base fixture 312, adhesive side up, as illustrated in FIG. 8 (step 1304). Next (step 1306), the pin mask 330 (shown in FIG. 11) is placed onto the pin side of the substrate 320. The substrate 320 (with the pin mask in place) is then placed into the substrate fixture 322 and secured using the frame 322 and four attachment screws (step 1308). The substrate fixture 322 is then assembled together with the base fixture 312 and secured by rotating the L brackets 314. At this point, the base of each heat sink 100 is aligned with a corresponding chip 332 (to which the heat sink is to be mounted) on the substrate 320. It should be understood that the substrate 320 and pin mask 330 are retained but vertically (in the Z direction) free floating within the fixture 322. The "pin side" of the substrate is plugged into the pin mask.

Next, the fixture assembly is placed in a convection oven, an air pressure line is attached to both the substrate fixture inlet 326, and the base fixture inlet 316. Air pressure is then applied (step 1310), pressurizing the inflatable membranes 318, 328. The assembly is then heated. After a being heated for 60 minutes at 235 degrees F. with 50 PSI of pressure applied to each of the membranes, the assembly is allowed to cool with the air pressure still applied (step 1312). After cooling, the membranes 318, 328 are deflated, the substrate fixture 322 is separated from the base fixture 312, the frame 324 is removed, and the completed substrate, now having attached heat sinks, is removed (step 1314).

Advantageously, the heat sinks can be easily removed from the substrate (and the integrated circuit chips) by heating the acrylic adhesive above its glass transition temperature ($T_G$) and then rotating the heat sink. The scores on the bottom of the heat sink cause the acrylic to adhere to the heat sink better than the chip. Thus, the entire heat sink and acrylic blank can be removed without damage to the chip or substantial acrylic waste residue from the adhesive.

Now that the invention has been described by reference to the preferred embodiments, many modifications and variations that do not depart from the scope and spirit of the invention will become apparent to those of skill in the art. Thus, it should be understood, that the preferred embodiments have been described by way of example and not by way of limitation. The scope of the invention is defined by the appended claims.

Having thus described our invention, what we claim as new and desire to secure by Letters Patent is:

1. An apparatus for attaching an array of substrate mounted integrated circuit chips to a plurality of heat sinks, comprising:
   a base fixture having a first inflatable membrane disposed on a surface thereof;
   a substrate fixture having a recess formed therein for receiving an integrated circuit carrying substrate;
   a second inflatable membrane disposed on a surface of the substrate fixture within the recess;
   fastening means for fastening the substrate fixture to the base fixture; and
   pin mask means disposed in the recess, for receiving pins of the integrated circuit carrying substrate.

2. An apparatus for tacking adhesive blanks to a plurality of heat sinks, comprising:
   a base fixture having a first inflatable membrane disposed on a surface thereof;
   a press plate having at least one recess formed therein for receiving the adhesive blanks and the plurality of heat sinks;
   holding means for holding the press plate in communication with the base fixture; and,
   a carrier plate having openings formed therein for receiving a portion of the heats sinks, said carrier plate being disposed between the base fixture and the press plate.

3. An apparatus for attaching an adhesive laden heat sink to a substrate carrying an electronic component, comprising:
   frame means for holding the substrate within the apparatus, the frame means comprising a frame for securing the substrate such that it can move freely along at least one axis within the apparatus;
   holding means for holding the heat sink in contact with the electronic component;
   first means for applying pressure to the substrate; and,
   second means for simultaneously applying pressure to the heat sink;
   wherein the substrate and the heat sink are simultaneously urged toward one another.

4. The apparatus of claim 3 wherein said first means and said second means each comprise an inflatable membrane.

5. The apparatus of claim 4, further comprising:
   pin mask means, disposed within said apparatus and adjacent to said frame means, for receiving pins of said electronic component protruding from said substrate.

* * * * *